US011430606B2

(12) United States Patent
Cappabianca et al.

(10) Patent No.: US 11,430,606 B2
(45) Date of Patent: Aug. 30, 2022

(54) COUPLED INDUCTOR STRUCTURES UTILIZING MAGNETIC FILMS (71) Applicant: Apple Inc., Cupertino, CA (US)

(72) Inventors: David P. Cappabianca, Gilroy, CA (US); Joseph T. DiBene, II, Santa Cruz, CA (US); Shawn Searles, Austin, TX (US); Le Wang, Santa Clara, CA (US); Yizhang Yang, Sunnyvale, CA (US); Sean Cian O'Mathuna, Cork (IE); Santosh Kulkarni, Cork (IE); Paul McCloskey, Cork (IE); Zoran Pavlovic, Cork (IE); William Lawton, Cork (IE); Graeme Maxwell, Cork (IE); Joseph O'Brien, Cork (IE); Hugh Charles Smiddy, Cork (IE)

(73) Assignee: Apple Inc., Cupertino, CA (US)

( * ) Notice: Subject to any disclaimer, the term of this patent is extended or adjusted under 35 U.S.C. 154(b) by 740 days.

(21) Appl. No.: 16/335,075

(22) PCT Filed: Aug. 24, 2017

(86) PCT No.: PCT/US2017/048506
§ 371 (c)(1),
(2) Date: Mar. 20, 2019

(87) PCT Pub. No.: WO2018/057227
PCT Pub. Date: Mar. 29, 2018

(65) Prior Publication Data
US 2019/0221365 A1 Jul. 18, 2019

Related U.S. Application Data (60) Provisional application No. 62/398,352, filed on Sep. 22, 2016.

(51) Int. Cl.
H01F 27/28 (2006.01)
H01F 41/34 (2006.01)
(Continued)

(52) U.S. Cl.
CPC ......... *H01F 41/34* (2013.01); *H01F 17/0006* (2013.01); *H01F 19/00* (2013.01);
(Continued)

(58) Field of Classification Search
CPC ...... H01F 41/34; H01F 17/0006; H01F 19/00; H01F 2017/008; H01L 28/10
See application file for complete search history.

(56) References Cited

U.S. PATENT DOCUMENTS 5,483,403 A 1/1996 Voegeli
5,609,946 A 3/1997 Korman et al.
(Continued)

FOREIGN PATENT DOCUMENTS

CN 1405801 A 3/2003
CN 103021625 4/2013
(Continued)

OTHER PUBLICATIONS

Office Action in Chinese Appl. No. 108104770 dated Feb. 19, 2020, 11 pages.
(Continued)

Primary Examiner — Tuyen T Nguyen
(74) Attorney, Agent, or Firm — Kowert, Hood, Munyon, Rankin & Goetzel, P.C.; Scott W. Pape; Dean M. Munyon (57) ABSTRACT An inductor is disclosed, including a first wire, a non-conductive material, and a shell. The non-conductive material may cover the first wire, with a portion of each end of the first wire uncovered. The shell may include a top portion and a bottom portion and include at least one magnetized layer and at least one gap between the first portion and the (Continued)

second portion. The shell may also surround a portion of the non-conductive material.

20 Claims, 10 Drawing Sheets

(51) Int. Cl.
*H01F 17/00* (2006.01)
*H01L 49/02* (2006.01)
*H01F 19/00* (2006.01)

(52) U.S. Cl.
CPC ........... *H01F 27/288* (2013.01); *H01L 28/10* (2013.01); *H01F 2017/008* (2013.01)

(56) References Cited

U.S. PATENT DOCUMENTS

| | | | | |
|---|---|---|---|---|
| 7,468,899 | B1 * | 12/2008 | Hopper | H01L 23/5227 323/272 |
| 7,468,999 | B2 * | 12/2008 | Konig | H01S 5/02461 372/50.12 |
| 8,102,236 | B1 | 1/2012 | Fontana, Jr. et al. | |
| 9,047,890 | B1 | 6/2015 | Herget | |
| 2001/0052837 | A1 * | 12/2001 | Walsh | H01F 17/0006 336/174 |
| 2002/0008605 | A1 | 1/2002 | Gardner | |
| 2008/0003699 | A1 * | 1/2008 | Gardner | H01L 28/10 438/3 |
| 2008/0003760 | A1 | 1/2008 | Gardner et al. | |
| 2008/0157910 | A1 | 7/2008 | Park et al. | |
| 2010/0283570 | A1 | 11/2010 | Lavoie | |
| 2013/0176095 | A1 | 7/2013 | Fontana, Jr. et al. | |
| 2016/0372449 | A1 | 12/2016 | Rusu et al. | |

FOREIGN PATENT DOCUMENTS

| | | | | |
|---|---|---|---|---|
| CN | 103748642 | | 4/2014 | |
| CN | 104702234 | | 6/2015 | |
| CN | 204809004 | | 11/2015 | |
| CN | 204857392 | | 12/2015 | |
| JP | 06342725 | A * | 12/1994 | |
| JP | 09-035937 | | 2/1997 | |
| JP | 2006-019506 | | 1/2006 | |
| JP | 2006019506 | A * | 1/2006 | ........... H01F 41/041 |
| JP | 2006-303405 | A | 11/2006 | |
| JP | 2009-033106 | A | 2/2009 | |
| JP | 2014504009 | | 2/2014 | |
| JP | 2014-175349 | A | 9/2014 | |
| JP | 2014175349 | A * | 9/2014 | ......... H01F 27/2804 |
| JP | 2014-192185 | A | 10/2014 | |
| TW | 200606963 | | 2/2006 | |
| TW | 201628029 | | 8/2016 | |

OTHER PUBLICATIONS

Office Action in CN Appl. No. 201780053118.2 dated Jul. 2, 2020, 9 pages.
Office Action in Japanese Appl. No. 2019-511928 dated Mar. 2, 2020, 7 pages.
Second Office Action in CN Appl. No. 201780053118.2 dated Apr. 30, 2021, 8 pages.
Office Action in GB Appl. No. 1900928.1 dated Apr. 29, 2021, 5 pages.
Notice of Preliminary Rejection in Korean Appl. No. 10-2019-7005059 dated Oct. 30, 2019, 5 pages.
Office Action in KR Appl. No. 10-2020-7028317 dated Dec. 21, 2020, 7 pages.
International Search Report and Written Opinion from PCT/US2017/048506, dated Dec. 5, 2017, 11 pages.
Office Action in JP Appl. No. 2020-194865 dated Dec. 6, 2021, 5 pages.
Fourth Office Action in CN Appl. No. 201780053118.2 dated Apr. 21, 2022, 10 pages.

* cited by examiner

COUPLED INDUCTOR STRUCTURES UTILIZING MAGNETIC FILMS

PRIORITY INFORMATION

This application claims priority to U.S. provisional patent application Ser. No. 62/398,352, entitled "COUPLED INDUCTOR STRUCTURES UTILIZING MAGNETIC FILMS," filed Sep. 22, 2016, which is hereby incorporated by reference in its entirety as though fully and completely set forth herein.

BACKGROUND

Technical Field

Embodiments described herein are related to the field of magnetic passive circuit components. More particularly, these embodiments relate to a structure for and method of creating inductive devices.

Description of the Related Art

Magnetic devices, such as, for example, inductors, may be used in a variety of circuits. Inductors may be used to resist fluctuations of an electric current. The current stabilizing property of inductors makes them useful in power supply circuits and voltage regulating circuits, helping to generate low noise power signals. Inductors may also be used in wireless circuits, particularly as part of an antenna circuit.

Inductor designs may be consume a significant amount of circuit board space when compared to other circuit components. Due to this, some electronic devices, in particular, small portable devices such as smartphones, for example, may use a minimal number of inductors to save space. Limiting a number of inductors may result in more complex circuit designs with reduced performance. An inductor design is desired which can be implemented into circuits without consuming significant space.

SUMMARY OF THE EMBODIMENTS

Various embodiments of an inductive device are disclosed. Broadly speaking, an inductor is disclosed, including a first wire, a non-conductive material, and a shell. The non-conductive material may cover the first wire, with a portion of each end of the first wire uncovered. The shell may include a top portion and a bottom portion and include at least one magnetized layer and at least one gap between the first portion and the second portion. The shell may also surround a portion of the non-conductive material.

In a further embodiment, a cross section of the first wire may include at least four sides. In another embodiment, the top portion of the shell may include a plurality of magnetized layers, wherein each layer is separated by a layer of non-conductive material, and wherein magnetic properties of each magnetized layer are different from one another.

In one embodiment, a second wire may be surrounded by the non-conductive material. The second wire may be parallel to the first wire, and the non-conductive material may fill a region between the second wire and the shell and between the second wire and the first wire.

In another embodiment, a cross section of both the first wire and the second wire may each correspond to a pentagonal shape. At least one adjacent side of the first wire may be oblique to a closest side of the second wire.

In a further embodiment, a cross section of the top portion of the shell may include a channel formed between the first wire and the second wire. A depth of the channel may be configured to impart a predetermined amount of inductance to the first wire and to the second wire. In an embodiment, the top portion of the shell may include a first portion and a second portion with another gap between the first portion and the second portion.

BRIEF DESCRIPTION OF THE DRAWINGS

The following detailed description makes reference to the accompanying drawings, which are now briefly described.

FIG. 3 includes two figures.

FIG. 9 includes two figures.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION

Due to size and cost restraints, inductors may be underutilized in small portable electronics. Inductors can improve the performance of some power supply, voltage regulation, wireless, and current regulation designs. Advantages, therefore, may exist in having an inductor design that is small and cost efficient for use in portable electronics. In some embodiments, it may be advantageous to include one or more inductive circuit elements coupled to an integrated circuit (IC), mounted either on or within the packaging of the IC, thereby freeing space on a circuit board.

It is noted that an "inductor" refers to an electronic component that resists changes in a current flowing through it. As current flows through an inductor, some energy resulting from the flow of current is temporarily stored in a magnetic field. When current passing through the inductor changes, the resulting change in the magnetic field induces a voltage in the inductor, which opposes the change in current. The amount of the opposition to current changes imparted by the magnetic field is characterized by a ratio of the voltage to the rate of change of the current, which is commonly referred to as inductance. Inductors may be employed in a variety of circuit applications and may be constructed using various manufacturing methods in order to achieve a desired inductance value.

Figure 1:
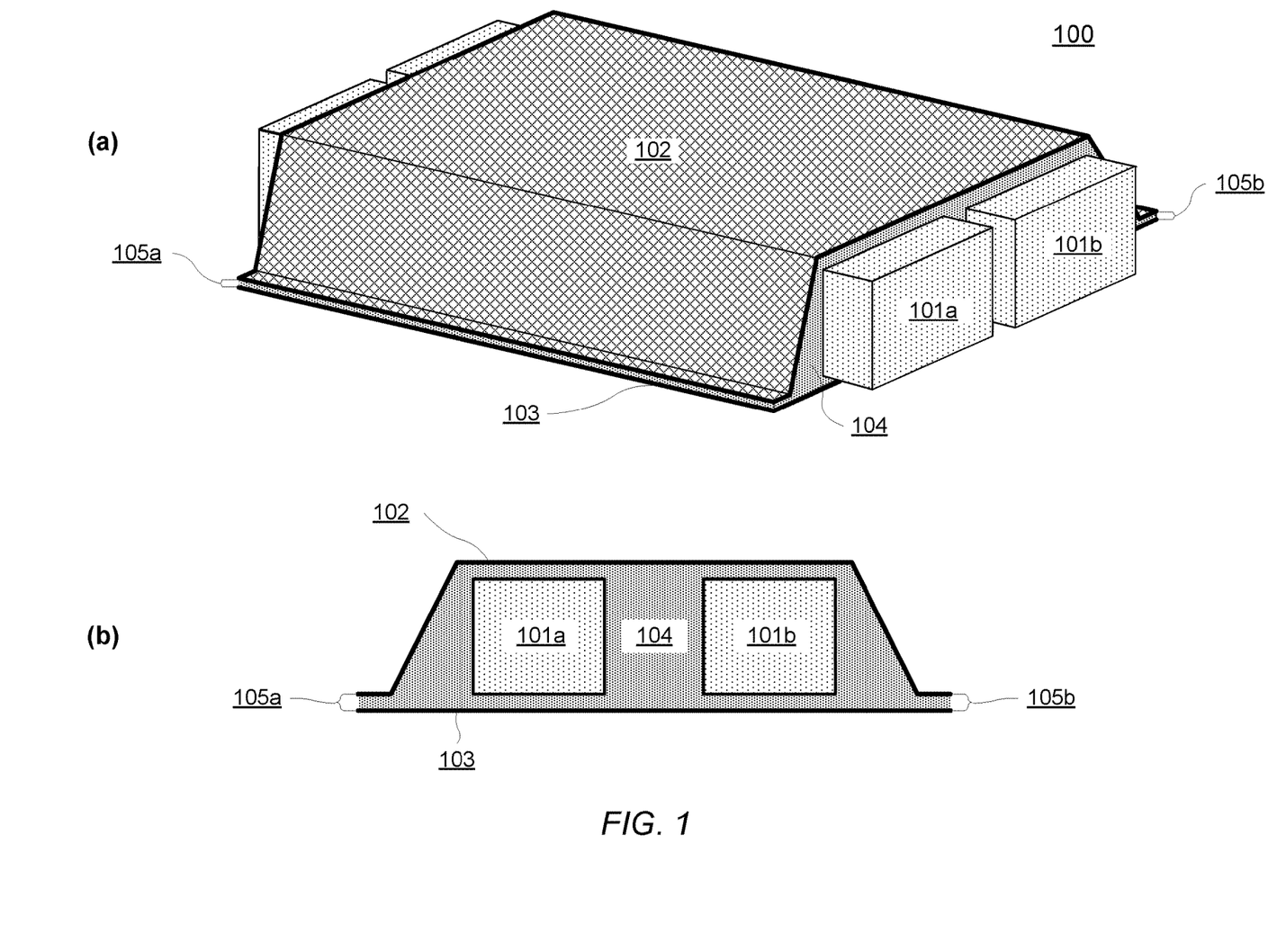
FIG. 1 illustrates two views of an embodiment of an inductor: (a) a three dimensional view, and (b) a cross sectional view.

Two views of an embodiment of an inductor are presented in FIG. 1. A three dimensional view of Inductor 100 is shown in FIG. 1a, while a cross-sectional view is shown in FIG. 1b. Inductor 100 includes Wires 101a and 101b surrounded by Non-Conductive Material 104. A magnetized shell is created from Upper Magnetized Shell Segment 102 and Lower Magnetized Shell Segment 103. Magnetized Shell Segments 102 and 103 are separated from each other by Shell Gaps 105a and 105b. Each end of Wires 101a and 101b extends past Non-Conductive Material 104 and Magnetized Shell Segments 102 and 103, and may be coupled to respective circuit nodes, thereby adding inductance to signals transmitted via Wires 101a-b. In some embodiments, terminals may be coupled to each end of Wires 101a-b, providing connection points from Inductor 100 to the respective circuit nodes.

Wires 101a-b may consist of any suitable conductive material, such as, but not limited to, gold, copper, aluminum, and the like. Wires 101a-b are shown as being approximately equal in shape. In other embodiments, however, Wire 101b may have different shape than Wire 101a. Although two Wires 101 are shown, any suitable number may be used, such as one wire, or three or more wires. Non-Conductive Material 104 may include any suitable substance, such as, but not limited to, silicon dioxide (i.e., glass), rubber, plastic, or combination thereof. Non-Conductive Material 104 may be used to fill the space between Wires 101a-b and Magnetized Shell Segments 102a-b and 103a-b providing support for Wires 101a-b and conductively isolating Wires 101a-b from each other as well as from the Magnetized Shell Segments 102 and 103. Upper Magnetized Shell Segment 102 and Lower Magnetized Shell Segment 103 collectively form a magnetized shell along a length of Wires 101a-b, increasing an amount of inductance associated with Wires 101a-b. Magnetized Shell Segments 102 and 103 may consist of any suitable compound capable of being magnetized, including, but not limited to, materials made with iron, cobalt, or nickel.

The amount of inductance in each of Wires 101a-b may be determined based on several properties of Inductor 100. For example, the length of Magnetized Shell Segments 102 and 103, as well as the magnetic properties of Magnetized Shell Segments 102 and 103, may influence a magnetic field generated by current flowing in either of Wires 101a-b. A surface area of each of Wires 101a-b that is exposed to the magnetic field may further influence the amount of inductance, as well as a distance between the outer surface of each of Wires 101a-b and the inner surface of Magnetized Shell Segments 102 and 103.

In the illustrated embodiment, Wires 101a-b are conductively isolated from each other, but are inductively coupled. A current running through Wire 101a may increase or decrease the inductance on Wire 101b, and vice versa. If currents in each wire are in the same direction, then an amount of inductance may be increased on each wire. Conversely, if the currents are in opposite directions, then the amount of inductance may be decreased in each wire.

Shell Gaps 105a-b may be included to control a saturation current of Inductor 100. As used herein, a "saturation current" corresponds to an amount of current through either Wire 101a or Wire 101b that results in either or both of Magnetized Shell Segments 102 and 103 to reach a magnetic field limit. A current through either Wire 101a or Wire 101b increases a magnetic field in Magnetized Shell Segments 102 and 103. As the current through the wire increases, so does the magnetic field of the shell segments. The saturation current corresponds to the amount of current through the wire that causes either Magnetized Shell Segment 102 or 103 (or both) to reach a limit of magnetization, i.e., the magnetic field in the Magnetized Shell Segment 102 or 103 ceases to increase at the same rate. If current through either wire of Inductor 100 reaches the saturation current, then a signal traveling through Inductor 100 may not be subjected to the expected amount of inductance and operation of a circuit coupled to Inductor 100 may be negatively impacted.

The shape and relative separations of Shell Gaps 105a-b may be adjusted during the manufacturing of Inductor 100 to modify the saturation current level. For example, increasing the width of Shell Gap 105a and/or Shell Gap 105b may increase the saturation current, allowing Inductor 100 to pass higher current values. Shell Gaps 105a and 105b may also make the manufacturing of Inductor 100 easier, as a slight misalignment between Magnetized Shell Segments 102 and 103 may not have a significant impact to the properties of Inductor 100.

It is noted that inductor 100 of FIG. 1 is merely an example for demonstration of disclosed concepts. The illustrated components are not necessarily shown to scale. The illustrated shapes, although shown with straight lines, may include curves and jagged edges consistent with a manufacturing process, such as a semiconductor fabrication process.

Figure 2:
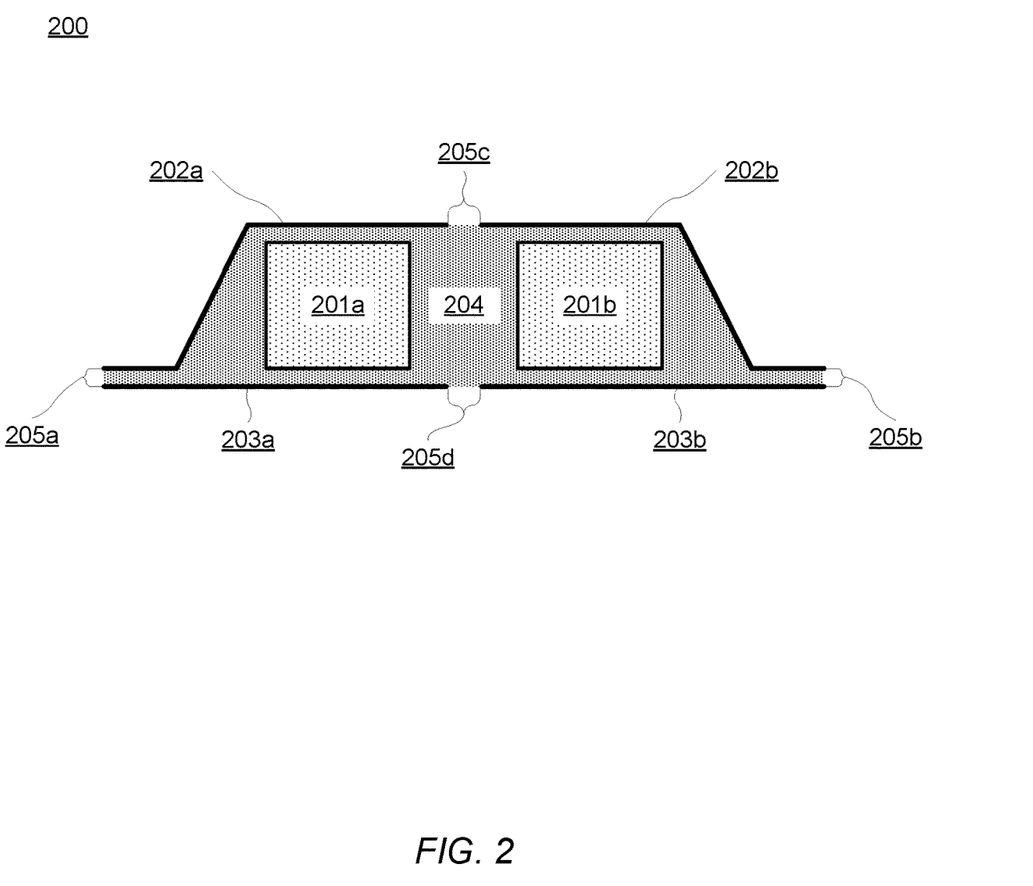
FIG. 2 illustrates a cross section of another embodiment of an inductor.

Moving to FIG. 2, a cross section of an embodiment of another inductor is illustrated. Inductor 200 is a variation of Inductor 100 of FIG. 1, and includes Wires 201a and 201b surrounded by Non-Conductive Material 204. A magnetized shell is created from Upper Magnetized Shell Segments 202a and 202b and Lower Magnetized Shell Segments 203a and 203b. Each of Magnetized Shell Segments 202a-b and 203a-b are separated from the closest adjacent Shell Segment by one of Shell Gaps 205a-d. Like Inductor 100, each end of Wires 201a and 201b may be coupled to respective circuit nodes, thereby adding inductance to signals transmitted via Wires 201a and 201b. Components of Inductor 200 correspond to the descriptions of the similarly named and numbered components of Inductor 100, except for differences as described below.

Shell gaps 205c and 205d may be added to further control a saturation current of Inductor 200. Similar to the description of Inductor 100, gaps between Magnetized Shell Segments 202a-b and 203a-b may increase a saturation current of Inductor 200. Adding Shell Gaps 205c-d to Shell Gaps 205a-b may further increase saturation current levels, allowing Inductor 200 to pass higher current than without Shell Gaps 205c-d.

Additionally, in some manufacturing processes, the widths of Shell Gaps 205c-d may be easier to control than the widths of Shell Gaps 205a-b. Although four gaps are illustrated, any suitable number of Shell Gaps 205 may be included, such as, e.g., removing Shell Gap 205d such that only three gaps are included. Moreover, Shell Gaps 205c-d may be placed at any suitable point along Magnetized Shell Segments 202a-b and 203a-b. An asymmetrical alignment of Shell Gaps 205c-d, may, however, result in different saturation currents for Wire 201a compared to Wire 201b.

It is noted that inductor 200 of FIG. 2 is one example for demonstration purposes. Some operational details have been omitted to focus on the disclosed subject matter. The illustrated components may not be shown to scale. Other embodiments may include more components.

Figure 3:
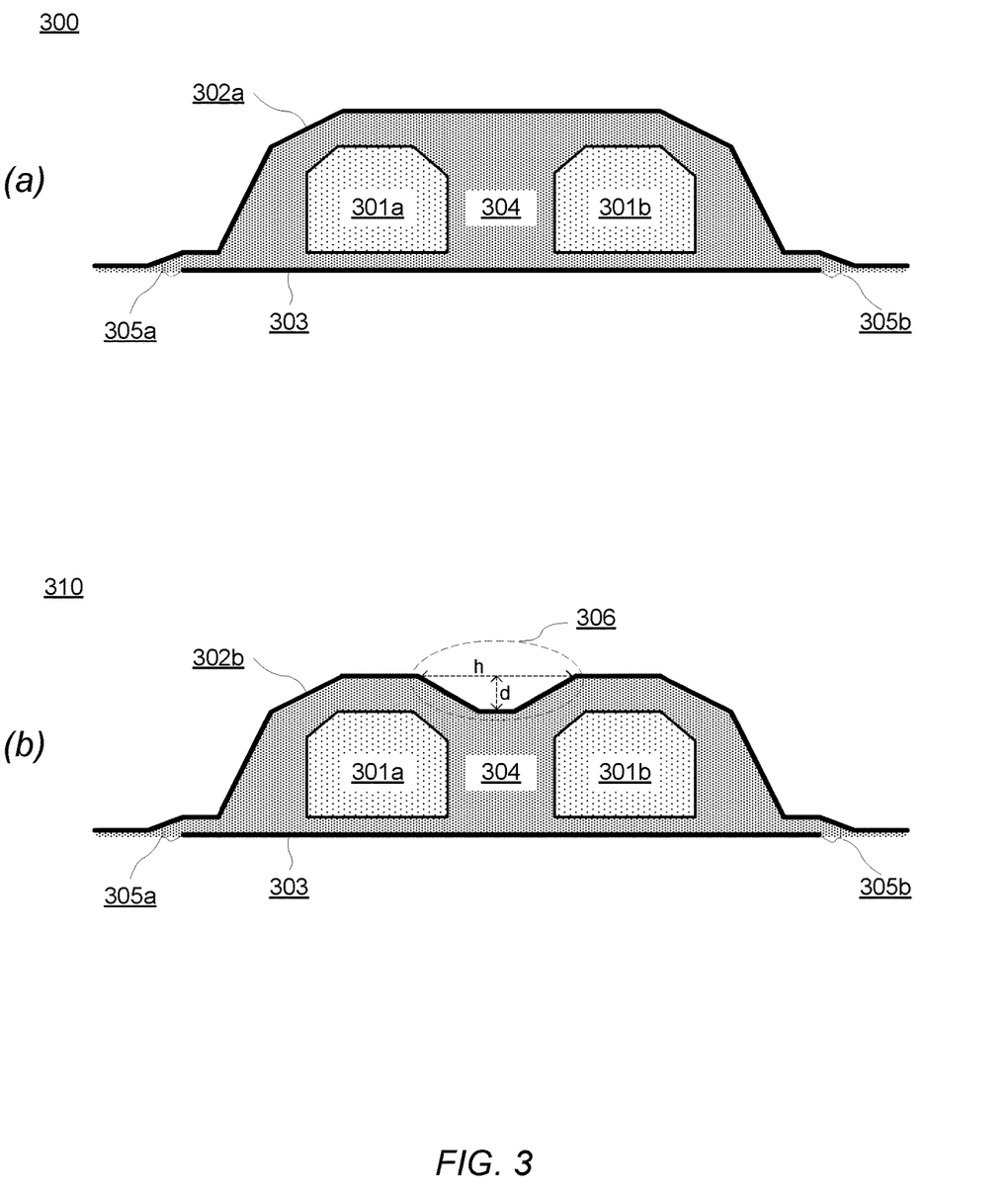
FIG. 3(a) depicts a cross section of a further embodiment of an inductor.
FIG. 3(b) depicts a cross section of a similar embodiment of an inductor including a channel in a magnetic shell.

Turning to FIG. 3, two similar embodiments of an inductor are shown. FIG. 3(a) depicts a cross section of a further embodiment of an inductor, and FIG. 3(b) depicts a cross section of a similar embodiment of an inductor including a channel in a magnetic shell. Inductor 300 is another embodiment of Inductor 100 in FIG. 1 and includes Wires 301a and 301b surrounded by Non-Conductive Material 304. As with Inductor 100, a magnetized shell is created from Upper Magnetized Shell Segment 302a and Lower Magnetized Shell Segment 303. Magnetized Shell Segments 302a and 303 are separated from each other by Shell Gaps 305a and 305b. Each end of Wires 101a and 101b extends past Non-Conductive Material 104 and Magnetized Shell Segments 102 and 103, and may be coupled to respective circuit nodes.

In the illustrated embodiment, the form and function of Inductor 300 is similar to the description of Inductor 100. Compared to Inductor 100, Inductor 300 includes extensions of Upper Magnetized Shell Segment 302a next to Shell Gaps 305a and 305b. These extensions may provide additional control for setting a desired saturation current in Inductor 300.

In addition, Wires 301a and 301b have a hexagonal shape, created by eliminating the top two corners of each wire to create a chamfered or beveled edge. The two beveled edges near the center of Inductor 300 may, in some embodiments, reduce an amount of inductive coupling between Wire 301a and Wire 301b by reducing a surface area of the adjacent facing sides of each of Wires 301a and 301b. The two beveled edges nearest the outside edges of Inductor 300 allow for Upper Magnetized Shell Segment 302a to be brought in closer to each of Wires 301a-b. Bringing the magnetized shell closer to the wires may allow Wires 301a-b to be in a stronger portion of a magnetic field from Upper Magnetized Shell Segment 302a, thereby creating a higher level of inductance through Wires 301a-b.

Inductor 310 of FIG. 3(b) includes the features of Inductor 300, with an addition of Channel 306 to Upper Magnetized Shell Segment 302b. Like Inductor 300, Inductor 310 includes Wires 301a-b, Non-Conducting Material 304, and Lower Magnetized Shell Segment 303.

Compared to Inductor 300, Inductor 310 includes Channel 306 running parallel to Wires 301a-b. In the illustrated embodiment, Channel 306 allows portions of Upper Magnetized Shell Segment 302b to be closer to each of Wires 301a-b, thereby increasing the inductive coupling between Upper Magnetized Shell Segment 302b and Wires 301a-b. The addition of Channel 306 may, in some embodiments, benefit further when combined with the beveled edge design of Wires 301a-b, by allowing Channel 306 to come closer to each of Wires 301a-b without making electrical contact.

A depth, denoted by the label "d" in FIG. 3(b), of Channel 306 may be adjusted to impart particular properties into Inductor 310. A greater depth may provide more coupling between Upper Magnetized Shell Segment 302b and Wires 301a-b, but reduce inductive coupling between Wire 301a and Wire 301b. A width (labeled "h" in FIG. 6) of Channel 306 may likewise be adjusted to modify particular properties of Inductor 310.

It is noted that Inductors 300 and 310 in FIG. 3 are examples for demonstration purposes. Some operational details have been omitted to focus on the disclosed subject matter. In other embodiments, additional components may be included, such as additional Wires 301. Relative sizes and shapes of the illustrated components are not intended to be shown to scale, and may differ based on a fabrication process used in the construction of each Inductor 300 and 310. Although Inductor 310 shows Channel 306 as a part of Upper Magnetized Shell Segment 302b, in other embodiments, another channel may be created as a part of Lower Magnetized Shell Segment 303 in addition to, or in place of, Channel 306.

Figure 4:
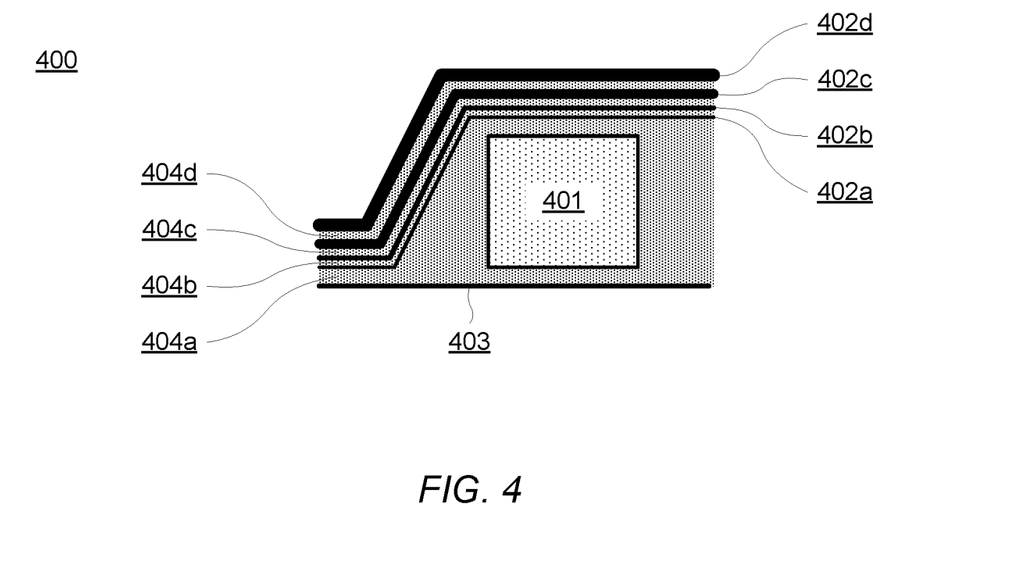
FIG. 4 illustrates a cross section of a portion of an embodiment of an inductor with a graded magnetic shell.

Proceeding to FIG. 4, a cross section of a portion of an embodiment of an inductor with a graded magnetic shell is depicted. Inductor 400 may correspond to a portion of Inductor 100 or Inductor 200, and illustrates a more detailed embodiment of a magnetized shell. Inductor 400 includes Wire 401 and Lower Magnetized Shell Segment 403. Multiple Magnetized Shell Segment Layers 402a-d are placed between multiple Non-Conductive Material Layers 404a-404d.

In the illustrated embodiment, an upper shell segment is created by layering Magnetized Shell Segment Layers 402a-d with Non-Conductive Material Layers 404b-404d separating each magnetized layer. Each of Magnetized Shell Segment Layers 402a-d may, in some embodiments, have different magnetic properties. A magnetic field of a magnetized object is weaker at increasing distances from the object. If the magnetic field from Magnetized Shell Segment Layer 402a is the same as Magnetized Shell Segment Layer 402d, then Wire 401 would be subjected to more of the magnetic field of Layer 402a than of Layer 402d. By increasing the strength of the magnetic field of Magnetized Shell Segment Layer 402d relative to Layer 402a, Wire 401 may be subjected to similar amounts of magnetic field from each magnetized layer.

In the illustrated embodiment, the magnetic field of each Magnetized Shell Segment Layer 402*a-d* is increased corresponding to its respective distance from Wire 401. In some embodiments, the magnetic field of each of Magnetized Shell Segment Layers 402*a-d* may be determined by adjusting a thickness of the Layer 402, by using a different material to create each Layer 402, by subjecting each layer to a different magnetization process, or any combination thereof. In addition, the thickness and/or composition of each Non-Conductive Material Layer 404*a*-404*d* may be adjusted to produce the desired properties of Inductor 400.

The layered magnetic shell may provide a process for adjusting an amount of inductance through Wire 401 as well as a process for adjusting a saturation current for Inductor 400. Although not illustrated, Lower Magnetized Shell Segment 403 may also be created using this layered approach.

It is noted that the embodiment illustrated in FIG. 4 is an example structure. Only a portion of Inductor 400 is shown to highlight particular aspects of the disclosed subject matter. In other embodiments, any suitable number of layers may be used. The illustrated embodiment may be used in combination with the other inductor structures disclosed herein.

Figure 5:
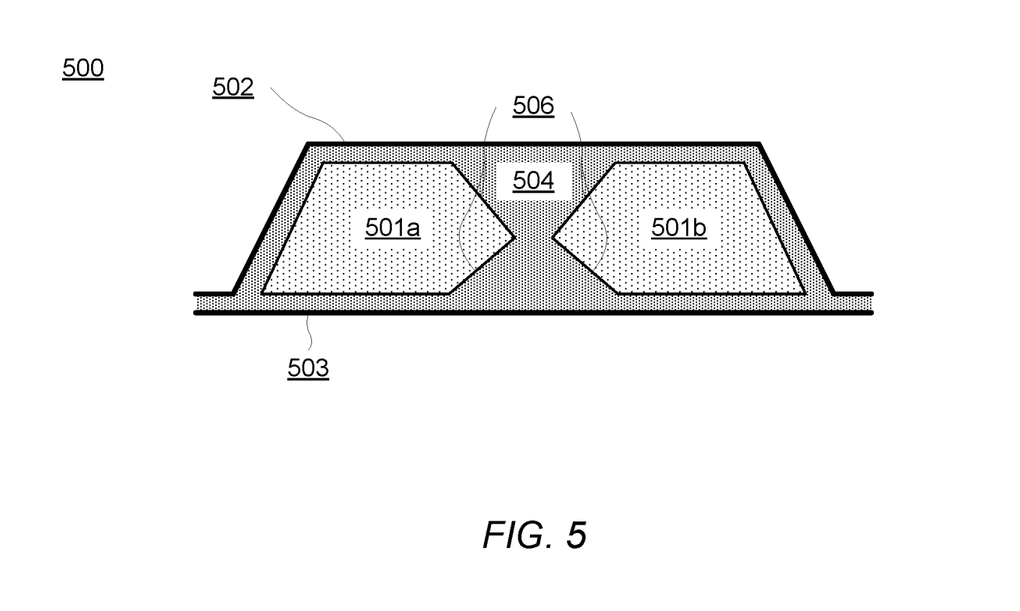
FIG. 5 illustrates an embodiment of an inductor with wires of a different shape.

Moving now to FIG. 5, an embodiment of an inductor with wires of a different shape is shown. Inductor 500 is another variation of Inductor 100 in FIG. 1. Similar to Inductor 100, Inductor 500 includes two Wires 501*a-b* surrounded by Non-Conductive Material 504. Upper and Lower Magnetized Shell Segments 502 and 503, respectively, collectively form magnetized shell around Wires 501*a-b*. Descriptions of Inductor 100 apply to Inductor 500, with exceptions noted below.

In the illustrated embodiment, Inductor 500 differs from Inductor 100 by the cross-sectional shape of Wires 501*a-b*. Whereas the cross-section of Wires 101*a-b* of Inductor 100 are shown as rectangles, the cross-section of Wires 501*a-b* are illustrated as asymmetric pentagonal shapes. The facing Sides 506 of Wires 501*a-b* are angled away from each other, e.g., are oblique to each other, thereby reducing an amount of inductive coupling between Wire 501*a* and Wire 501*b*. The angles of Sides 506 may be adjusted to achieve a desired amount of coupling between Wires 501*a-b*.

The other sides of Wires 501*a-b* may be created approximately parallel to corresponding sides of Upper and Lower Magnetized Shell Segments 502 and 503. By making the sides of Wires 501*a-b* parallel to the corresponding sides of the magnetized shell, the magnetic fields coupled between Wires 501*a* and 501*b* and Upper and Lower Magnetized Shell Segments 502 and 503 may be increased and, in some embodiments, may be more uniform as compared to Inductor 100. Wires 501*a-b* are shown as being approximately equal in shape. In other embodiments, however, Wire 501*b* may have different size and/or shape than Wire 501*a*.

It is noted that, as used herein, "parallel" is not intended to imply two perfectly equidistant objects. Instead, "parallel" is intended to describe two or more objects that are approximately uniform in distance from one another, within the limits of contemporary manufacturing capabilities. It is noted that one of ordinary skill in the art would understand that parallel wires, as used herein, refer to two or more wires that are substantially parallel to each other, but may run askew of one another by several degrees due to limitations of the manufacturing capabilities.

It is further noted that FIG. 5 is merely an example. In other embodiments, the structure of inductor 500 may differ from the structure illustrated. For example, although five sides for each wire are shown, any suitable number of sides may be utilized to correspond to various shapes of the corresponding magnetic shell.

Figure 6:
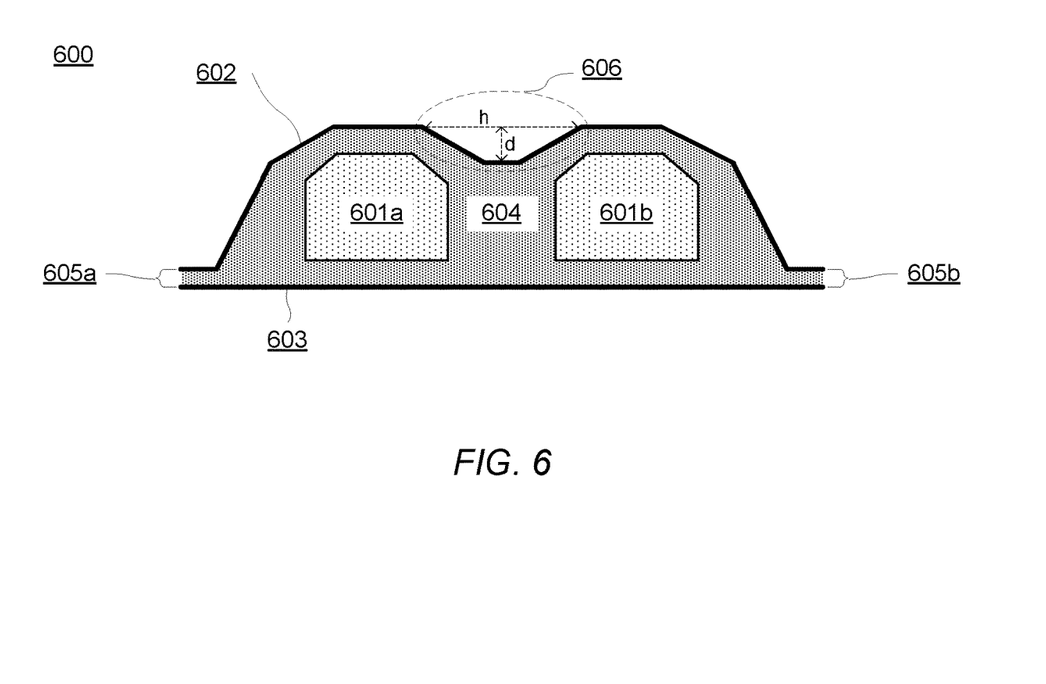
FIG. 6 illustrates an embodiment of another inductor with a channel in a magnetic shell.

Turning now to FIG. 6, another embodiment of an inductor with a channel in a magnetic shell is shown. Inductor 600 is similar in structure to Inductor 310 in FIG. 3(*b*). Components of Inductor 600 are as described above in regards to Inductor 310, except where noted. Inductor 600 includes Wires 601*a-b*, Non-Conducting Material 604, and Upper and Lower Magnetized Shell Segments 602 and 603. Channel 606 is included in Upper Magnetized Shell 602. Inductor 600 differs from Inductor 310 by excluding the extensions of Upper Magnetized Shell Segment 302*a*, leaving Shell Gaps 605*a* and 605*b* similar to Shell Gaps 105*a* and 105*b* described in regards to Inductor 100 in FIG. 1. Excluding these extensions may simplify a process for manufacturing Inductor 600.

It is noted that Inductor 600 in FIG. 6 is one example for demonstration purposes. Some operational details have been omitted to focus on the disclosed subject matter. The illustrated structures may not be shown to scale. Other embodiments may include more components.

Figure 7:
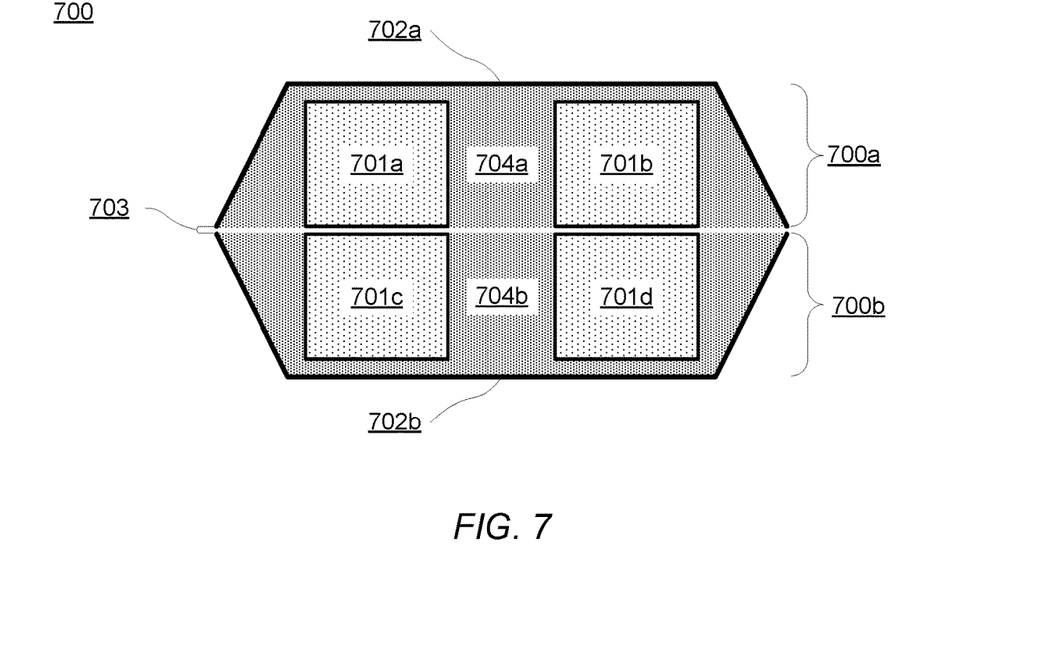
FIG. 7 shows an embodiment of an inductor created by combining two similar inductive structures.

Turning to FIG. 7, an embodiment of an inductor created by combining two similar inductive structures is illustrated. First Inductive Structure 700*a* includes Wires 701*a-b* surrounded by Non-Conductive Material 704*a* and partially covered by Magnetized Shell Segment 702*a*. Second Inductive Structure 700*b* includes Wires 701*c-d* surrounded by Non-Conductive Material 704*b* and partially covered by Magnetized Shell Segment 702*b*.

Inductor 700 is formed by combining Inductive Structures 700*a* and 700*b* by inverting Structure 700*b* and attaching it to the bottom of Structure 700*a*. Both Inductive Structures 700*a* and 700*b* may, in some embodiments, be created in a semiconductor fabrication process. Structure 700*a* may be attached to Structure 700*b* using any suitable adhesive, such as, for example, a non-conductive epoxy. Gap 703 may include the adhesive as well as additional non-conductive material. Similar to the Shell Gaps 105*a-b* discussed in regards to Inductor 100 in FIG. 1, Gap 703 between Structures 700*a* and 700*b* may be adjusted to achieve desired properties, such as an amount of inductance and control a level of saturation current through Wires 701*a-d*. In some embodiments, Wires 701*a-d* may be conductively isolated from one another, resulting in Inductor 700 being capable of passing four separate signals. In other embodiments, Wires 701*a* and 701*b* may be conductively coupled to Wires 701*c* and 701*d*, respectively, resulting in Inductor 700 capable of passing two signals. In such embodiments, Wires 701*a* and 701*c*, as well as Wires 701*b* and 701*d*, may be attached using any suitable method, such as metal vias, metal bumps on the adjoining sides, and the like.

It is noted that FIG. 7 is merely an example. Although two wires are shown in each of Structures 700*a* and 700*b*, any suitable number of wires may be used. Other inductive structures disclosed herein may be used in combination with the concepts disclosed in regards to Inductor 700.

Figure 8:
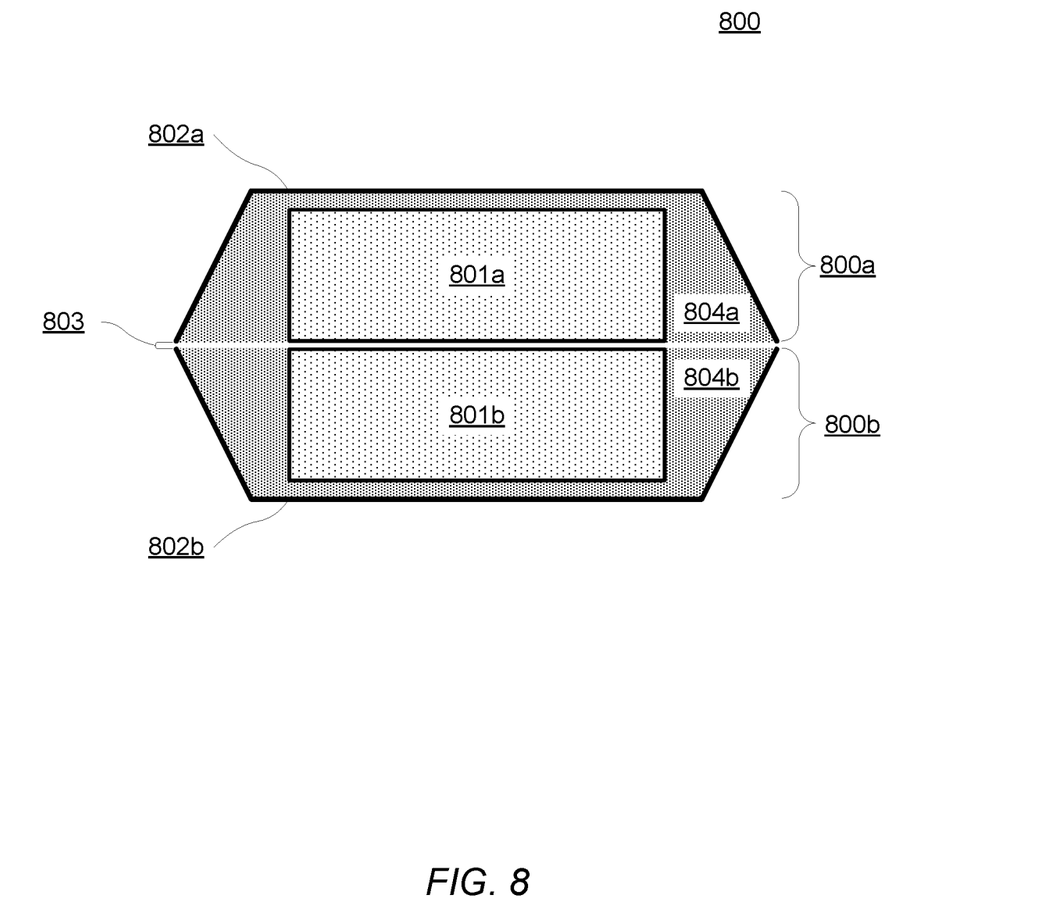
FIG. 8 depicts another embodiment of an inductor created by combining two similar inductive structures with a reduced number of wires.

Moving to FIG. 8, another embodiment of an inductor created by combining two similar inductive structures with a reduced number of wires is illustrated. A first Inductive Structure 800*a* includes Wire 801*a* surrounded by Non-Conductive Material 804*a* and partially covered by Magnetized Shell Segment 802*a*. Second Inductive Structure 800*b* includes Wire 801*b* surrounded by Non-Conductive Material 804*b* and partially covered by Magnetized Shell Segment 802*b*.

Inductor 800 is similar in design to Inductor 700 and the description of Inductor 700 may, therefore, apply to Inductor

800. Inductor 800 demonstrates use of a different number of wires per each of Structures 800a and 800b. Instead of two wires per structure, Structures 800a and 800b each include Wire 801a and 801b, respectively. Wires 801a-b may be attached to form a single conductor through Inductor 800, or may be isolated so Inductor 800 includes two conductors. As described for Inductor 700 above, a width of a gap between Structures 800a and 800b (Gap 803), may be adjusted to modify inductive parameters of Inductor 800.

It is noted that FIG. 8 is an example for demonstrating disclosed concepts. Relative sizes and shapes of the illustrated components are not intended to be shown to scale, and may differ based on a fabrication process used in the construction of Inductor 800.

Figure 9:
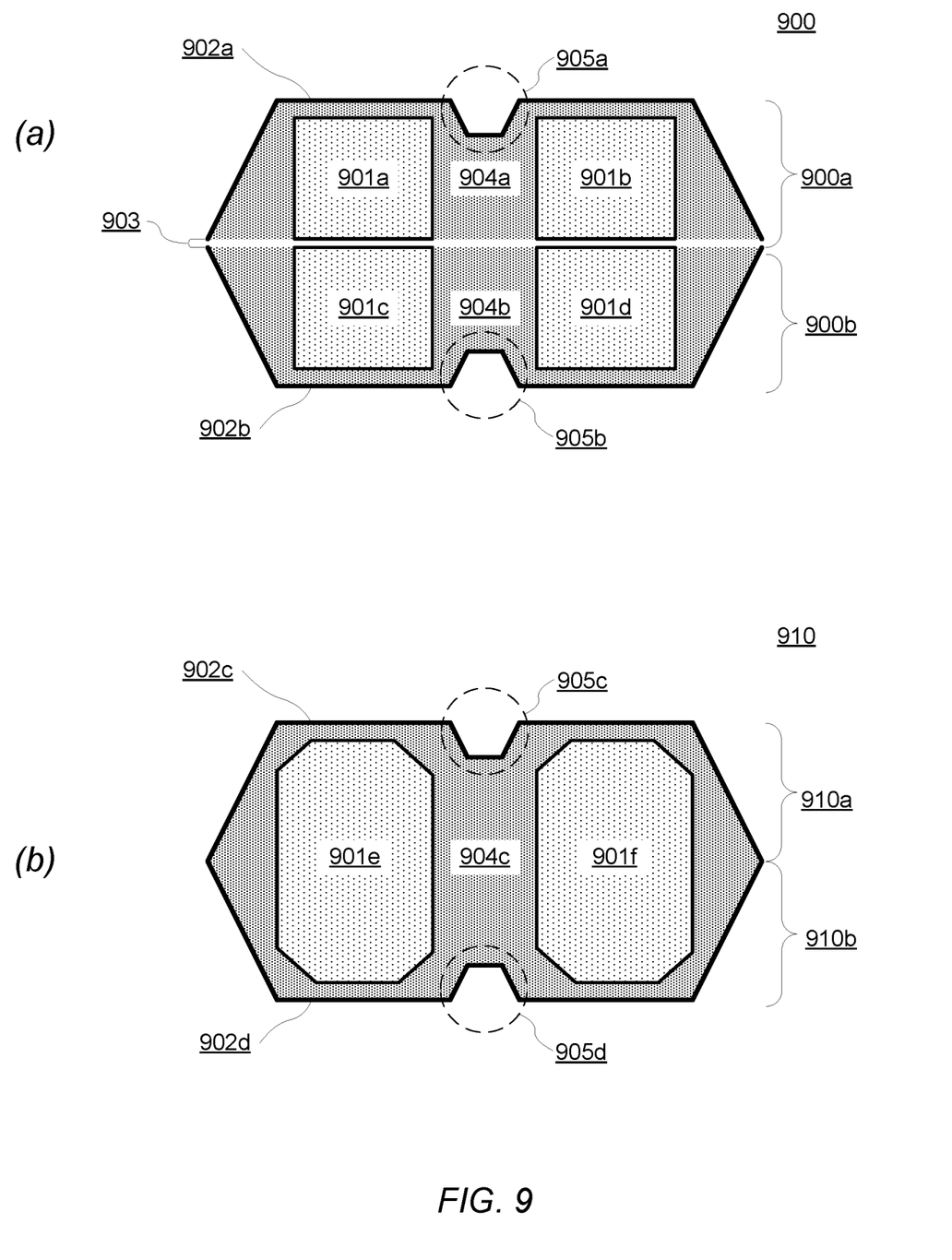
FIG. 9(a) illustrates an embodiment of an inductor created by combining two similar inductive structures, including a gap between the two structures.
FIG. 9(b) illustrates a similar embodiment of an inductor created using two similar inductive structures, without a gap between the two structures.

Turning now to FIG. 9, two figures are shown. FIG. 9(*a*) illustrates an embodiment of an inductor created by combining two similar inductive structures, including a gap between the two structures, while FIG. 9(*b*) illustrates a similar embodiment of an inductor without a gap between the two structures. Inductor 900 is another variation of Inductor 700 shown in FIG. 7. Inductor 900 includes a first Inductive Structure 900a including Wires 901a-b surrounded by Non-Conductive Material 904a and partially covered by Magnetized Shell Segment 902a. A second Inductive Structure 900b includes Wires 901c-d surrounded by Non-Conductive Material 904b and partially covered by Magnetized Shell Segment 902b. Inductive Structures 900a and 900b also include Channels 905a and 905b, respectively.

Inductor 900 may be created as described above in regards to Inductor 700. The addition of Channels 905a and 905b may provide further capabilities for controlling parameters of Inductor 900, such as a level of inductance on Wires 901a-901d and a saturation current level. Although Channels 905a-b are shown as having similar shapes, including width and depth, each channel may be shaped independently to achieve desired properties. In some embodiments, either of Channels 905a-b may be omitted, leaving a single channel on one side of Inductor 900.

Similar to Gap 703 discussed in regards to Inductor 700 in FIG. 7, Gap 903 between Structures 900a and 900b may be adjusted, in combination with Channels 905a and 905b, to further achieve desired properties. Wires 901a-d may be conductively isolated from one another, resulting in Inductor 900 being capable of passing four separate signals.

Similar to Inductor 900, Inductor 910 in FIG. 9(*b*), includes Inductive Structures 910a and 910b, each with a respective magnetized shell, Magnetized Shell Segment 902c and Magnetized Shell Segment 902d. Magnetized Shell Segments 902c and 902d each include a respective one of Channel 905c and Channel 905d. Inductor 910 differs from Inductor 900 by elimination of Gap 903. Wires 901a and 901c, as well as Wires 901b and 901d of Inductor 900 are joined to create Wires 901e and 901f, respectively. The two halves of Wires 901e and 901f, each included in Inductive Structures 910a and 910b, may be attached using any suitable method, such as metal vias, metal bumps on the adjoining sides, and the like. Similarly, Non-Conductive Material 904a and 904b are joined to form a single Non-Conductive Material 904c, surrounding both Wire 901e and 901f.

Magnetized Shells 902c and 902d are illustrated as touching. In other embodiments, however, Magnetized Shells 902c and 902d may be trimmed, or otherwise shortened, to leave a gap between the two magnetized shells on one or both sides of Inductor 910. Additionally, Inductor 910 differs from Inductor 900 in regards to the shape of Wires 901e and 901f, which are beveled at the corners, similar to Wires 301a and 301b of FIG. 3. Beveling these corners of Wires 901e and 901f, may increase an inductive coupling to Magnetized Shell Segments 902c and 902d.

Inductor 910 may, in some embodiments, provide a higher amount of inductance than some of the other embodiments disclosed herein, for inductors of a similar size. The adjacent sides of Wires 901e and 901f may provide a greater amount of inductive coupling between the two wires, than, for example, Wires 301a and 301b in FIG. 3. In addition, an ability to change the widths and depths of each of Channels 905c and 905d may provide capability to adjust an amount of inductance coupled to each of Wires 901e and 901f from Magnetized Shells 902c and 902d.

It is noted that Inductors 900 and 910 in FIG. 9 are merely examples. Relative shapes and sizes of components may also differ for various embodiments, including, for example, the various geometries shown elsewhere herein. For example, the beveled corners of Wires 901e and 901f may be omitted, leaving the wires in a rectangular shape. In other embodiments, the number of Wires 901 included in Inductor 900 may vary.

Figure 10:
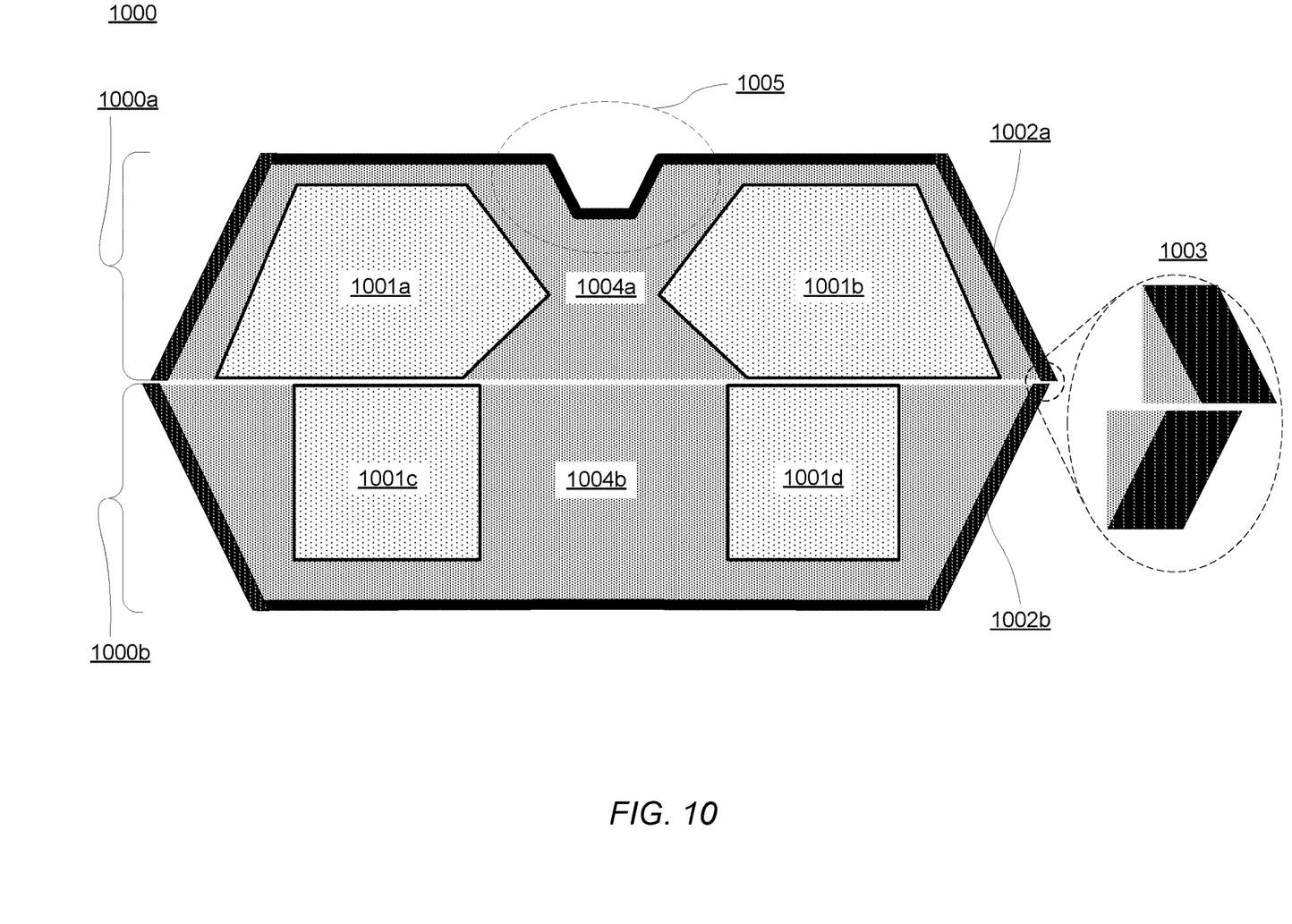
FIG. 10 illustrates alignment of an embodiment of an inductor created by combining two similar inductive structures.

Moving now to FIG. 10, alignment of an embodiment of an inductor created by combining two similar inductive structures is illustrated. Inductor 1000 is a further variation of the concepts disclosed for Inductor 700 in FIG. 7. Inductor 1000 includes a first Inductive Structure 1000a, including Wires 1001a-b, Non-Conductive Material 1004a, Magnetic Shell Segment 1002a, and Channel 1005. A second Inductive Structure 1000b includes Wires 1001c-d, Non-Conductive Material 1004b, and Magnetic Shell Segment 1002b.

It is noted that, in the illustrated embodiment, Inductive Structures 1000a-b are dissimilar, in that Structure 1000a includes Channel 1005, while Structure 1000b does not include a channel. Additionally, Wires 1001a-b are approximately pentagonally shaped while Wires 1001c-d are rectangular in shape. The dissimilarities are included to demonstrate that Inductive Structures are not required to be "mirror images" of each other to be joined into a single inductor.

Expanded View 1003 illustrates a detailed image of a misalignment of Structure 1000a to Structure 1000b. In the illustrated embodiment, misalignment of the two structures, in particular Magnetic Shell Segments 1002a to 1002b, may result in undesired properties for Inductor 1000. The amount of inductance through Inductor 1000 may, in some embodiments, be reduced due to misalignment. Other adjustments, as disclosed herein, may be used to mitigate potential reductions due to misalignment. For example, any combination of sizes and shapes of Wires 1001a-d, widths and depths of Channel 1005, the thickness of Magnetic Shell Segments 1002a to 1002b, along with other properties, may be adjusted to compensate for potential reductions in the amount of inductance due to tolerances of the manufacturing process.

It is noted that Inductor 1000 does not include extensions of Magnetized Shell Segments 1002a-b at their closest points. Referring to Inductor 100 in FIG. 1, both Upper Magnetized Shell Segment 102 and Lower Magnetized Shell Segment 103 extend outward, away from Wires 101a-b and approximately parallel to each other. If the Magnetized Shell Segments 102 and 103 are created using a layered process as described in regards to FIG. 4, then the outside layers are farther apart than the inside layers at Shell Gaps 105a-b.

This unequal distance may cause losses in the magnetic fields generated when current flows through either Wire 101*a* or 101*b*.

In contrast, Magnetized Shell Segments 1002*a-b* end askew to each other. As shown in Expanded View 1003, if Magnetized Shell Segments 1002*a-b* are layered, then each layer is approximately the same distance from a corresponding layer in the opposing Magnetized Shell Segment 1002. Even if Structure 1000*a* is misaligned to Structure 1000*b*, distances between respective layers of Magnetized Shell Segments 1002*a-b* may be similar for each layer. Compared to Inductor 100, this higher level of consistency between the layers of Magnetized Shell Segments 1002*a-b* may result in reduced losses in the magnetic fields generated when current flows through any of Wires 101*a-d*.

It is noted that FIG. 10 is merely one embodiment. Elements of the inductive device 1000 may be combined with other concepts disclosed herein. Relative scales of the illustrated components may differ in other embodiments.

It is also noted that any suitable combination of the inductor structures disclosed herein are contemplated. For example, the shell gaps shown in Inductor 200 in FIG. 2 may be combined with the shaped wires of Inductor 500 in FIG. 5 and combined with a second such structure to form a mirrored inductor design similar to Inductor 900 in FIG. 9. One or more channels could also be added to the magnetized shells.

Figure 11:
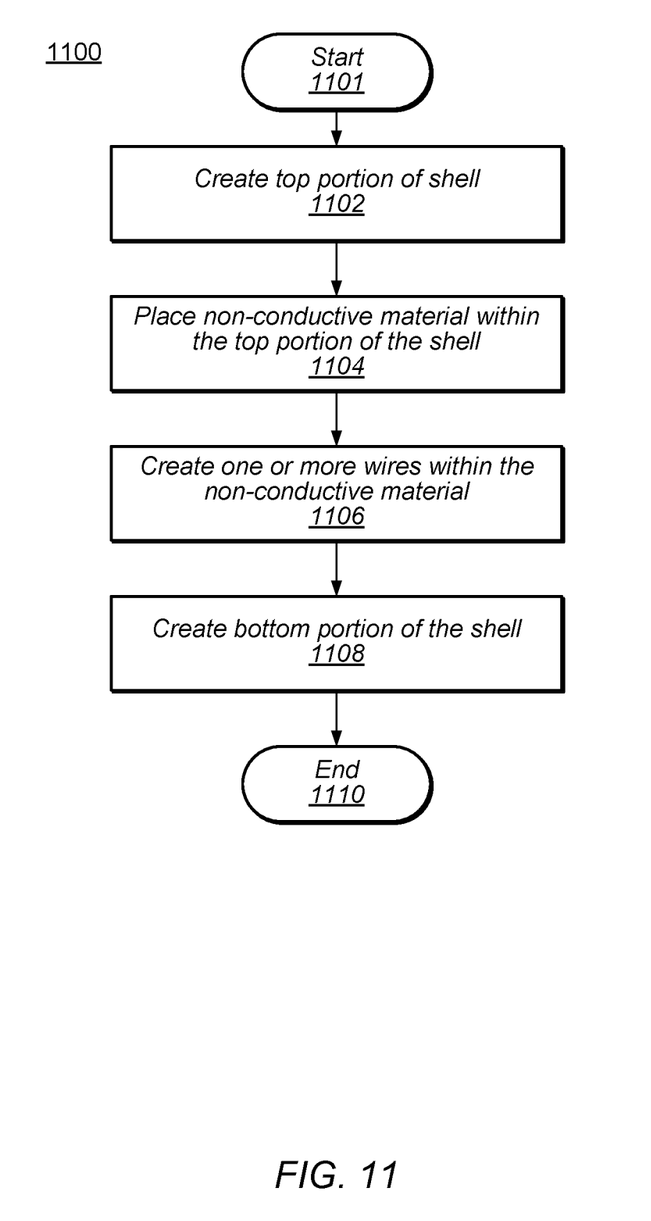
FIG. 11 shows a flow diagram of an embodiment of a method for constructing an inductor.

Moving to FIG. 11, a flow diagram of an embodiment of a method for constructing an inductor is shown. Method 1100 may be applied to a manufacturing process for creating an inductive structure, such as, for example, any of Inductors 100 to 1000 presented herein. Referring collectively to FIG. 1 and the flow diagram of FIG. 11, Method 1100 begins in block 1101.

A top portion of a shell is created (block 1102). A top portion of a magnetized shell is formed in a shape such as Upper Magnetized Shell Segment 102. Various methods may be utilized for creating the top portion of the magnetized shell, such as, e.g., a depositing a magnetic material via a physical vapor deposition (PVD) process or chemical vapor deposition (CVD) process. The magnetic material may include iron, nickel, cobalt, or other magnetic substance. The magnetic material may be magnetized before it is deposited, or may be magnetized after deposition. In some embodiments, the top portion of the magnetized shell may be created as described for Magnetized Shell Segment Layers 402*a-d* in FIG. 4, by alternating layers of magnetic material with layers of a non-magnetic, non-conductive material. The top portion of the magnetic shell may correspond to any suitable shape, including any shape of Upper Magnetized Shell Segments illustrated herein. One or more shell gaps, in some embodiments, may be created in the magnetized shell after the shell has been created by etching a gap into the shell to create a top portion of the magnetic shell similar to Upper Magnetic Shell Segments 202*a-b* in FIG. 2.

A non-conductive material is placed within the top portion of the magnetic shell (block 1104). A non-conductive material, such as, for example, silicon oxide (glass), nitride, plastic, rubber, and the like, is placed within the previously formed top portion of the magnetic shell. Plastic or rubber compounds may be deposited with a similar CVD or PVD process. A glass material may be created by first placing a silicon layer (e.g., a polysilicon layer) and exposing it to high oxygen levels under high temperatures. A nitride layer may be created in a similar process by replacing the oxygen with nitrogen. When complete, the non-conductive material may fill all or most of a space within the top portion of the magnetic shell.

One or more wires are created within the non-conductive material (block 1106). Before a conductive metal may be added to form the wire, channels may need to be etched into the non-conductive material. Referring to FIG. 1, after the non-conductive material is added, the space occupied by Wires 101*a-b* may be filled by the non-conductive material. An etch process may be used to form channels corresponding to a desired shape for the wires, including shapes corresponding to Wires 101*a-b*, Wires 301*a-b* in FIG. 3, or Wires 501*a-b* in FIG. 5. After channels are created for the one or more wires, a conductive metal, such as, for example, aluminum, copper, or gold, is placed into the channels, using, for example, a deposition process. In some embodiments, additional non-conductive material may be added to cover the newly formed wires.

A bottom portion of the magnetic shell is created (block 1108). The bottom portion of the magnetic shell is formed using a similar process as used to create the top portion, as described in block 1102. In some embodiments, a planarization step may be performed prior to creating the bottom portion of the magnetic shell. If an inductor structure such as shown in FIGS. 7-10 is being manufactured, then the bottom portion of the magnetic shell may be omitted, and instead, two structures are created using operations 1102 through 1106, and then the two structures are joined using an adhesive. The method ends in block 1110.

It is noted that Method 1100 in FIG. 11 is an example process for manufacturing an embodiment of an inductor. The operations have been simplified for clarity. In other embodiments, more or fewer operations may be included.

Figure 12:
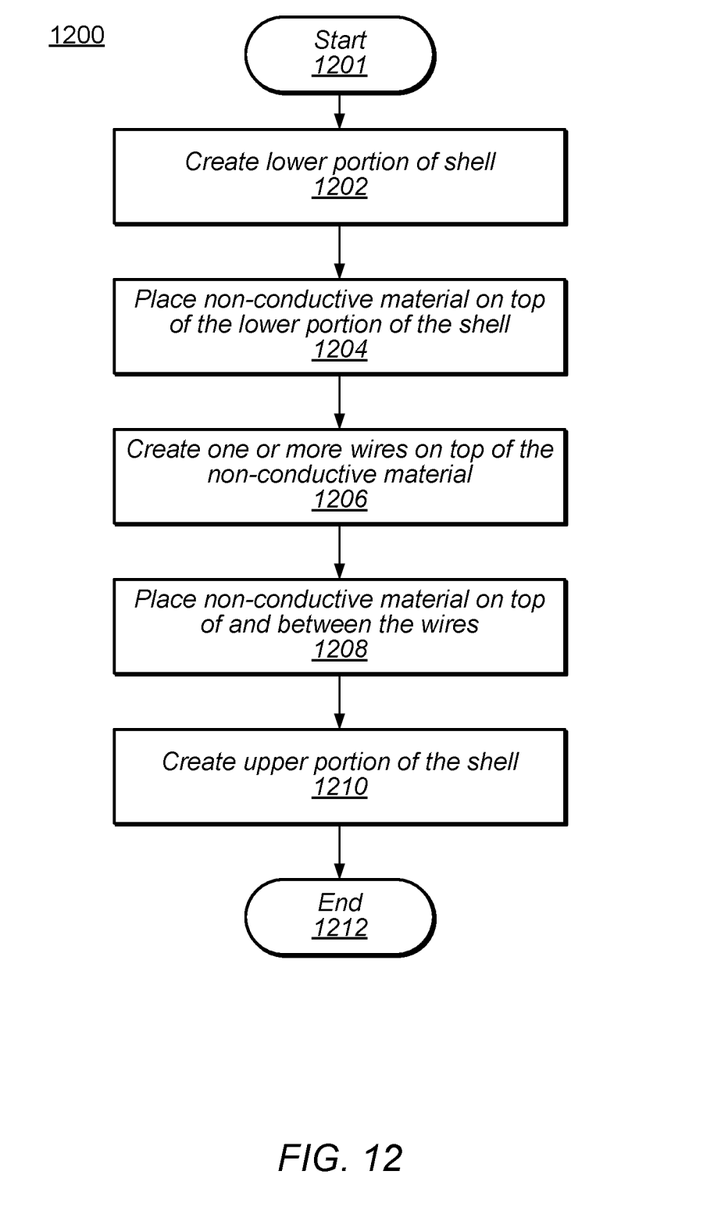
FIG. 12 shows a flow diagram of another embodiment of a method for constructing an inductor.

Proceeding to FIG. 12, a flow diagram of an embodiment of a method for constructing an inductor is shown. Method 1200, similar to Method 1100 in FIG. 11, may be applied to a process for manufacturing an inductive structure, such as, for example, any of Inductors 100 to 600 presented herein. Referring collectively to FIG. 1 and the flow diagram of FIG. 12, Method 1200 begins in block 1201.

A lower portion of a shell is created (block 1202). A lower portion of a magnetized shell is formed in a shape such as Lower Magnetized Shell Segment 103. The lower portion of the magnetized shell may be created from similar materials, using similar processes as described above in block 1102 of Method 1100. As previously disclosed, the magnetic material may be magnetized before it is deposited, or may be magnetized after deposition. In some embodiments, the lower portion of the magnetized shell may be created as described for Magnetized Shell Segment Layers 402*a-d* in FIG. 4, by alternating layers of magnetic material with layers of a non-magnetic, non-conductive material. The lower portion of the magnetic shell may or may not include a channel gap as described in regards to FIG. 6. One or more shell gaps, in some embodiments, may be created in the magnetized shell after the shell has been created by etching a gap into the shell to create a lower portion of the magnetic shell similar to Lower Magnetic Shell Segments 203*a-b* in FIG. 2.

A non-conductive material is placed on top of the lower portion of the magnetic shell (block 1204). A non-conductive material, such as, for example, silicon oxide, nitride, plastic, or rubber, is placed on top of the previously formed lower portion of the magnetic shell. Any suitable process such as disclosed above in regards to block 1104 of Method 1100 may be used to place the non-conductive material. The non-conductive material may be placed with a thickness corresponding to a desired width of a gap such as, for example, Shell Gap 205*a-b* in FIG. 2. In other embodiments, the non-conductive material may be placed thicker than the desired width of the gap and then the excess removed using a process such as, e.g., an etch or a planarization process.

One or more wires are created on top of the non-conductive material (block 1206). A conductive metal, such as, for example, aluminum, copper, or gold, is placed on top of the non-conductive material, using, for example, a deposition process. In some embodiments, the metal may be deposited over all of the non-conductive material, and then the excess metal etched away to leave the wires in a desired shape. In addition, the non-conductive material may be shaped to support a non rectangular wire shape, such as shown in FIG. 5, by Wires 101*a-b* and Non-Conductive Material 504.

Additional non-conductive material is placed on top of and around the one or more wires (block 1208). Additional non-conductive material is placed around the one or more wires created in block 1206. In some embodiments, the non-conductive material is etched after being placed to conform to a desired shape for an upper portion of the magnetized shell.

A upper portion of the magnetic shell is created (block 1210). The upper portion of the magnetic shell is formed using a similar process as used to create the lower portion, as described in block 1202. The non-conductive material surrounding the one or more wires may be etched prior to creating the upper portion of the magnetic shell in order to establish a shape for the upper portion. For example, referring to FIG. 6, a channel may be etched into the non-conductive material to create Channel 605. The upper magnetic shell is created using one or more layers of a magnetic material such as, for example, iron, nickel, cobalt, or other magnetic substance. As described above, the upper magnetized layer may be magnetized before application or after being created. The method ends in block 1212.

It is noted that Method 1200 in FIG. 12 is an example process for manufacturing an embodiment of an inductor. The operations have been simplified for clarity. In other embodiments, more or fewer operations may be included.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    an inductor, including:
        a first wire;
        a second wire, parallel to the first wire;
        a non-conductive material covering the first wire and the second wire; and
        a shell, including an upper portion and a lower portion, surrounding a portion of the non-conductive material, wherein the shell includes at least one magnetized layer and at least one gap between the upper portion and the lower portion, and wherein an end of the upper portion of the shell extends past an end of the lower portion of the shell at an edge of the inductor where the at least one gap is formed.

2. The apparatus of claim 1, wherein the upper portion of the shell includes a first portion and a second portion with another gap between the first portion and the second portion.

3. The apparatus of claim 1, wherein the upper portion of the shell includes a plurality of magnetized layers, wherein each layer is separated by a layer of non-conductive material, and wherein magnetic properties of each magnetized layer are different from one another.

4. The apparatus of claim 1, wherein a cross section of both the first wire and the second wire each corresponds to a rectangular shape.

5. The apparatus of claim 1, wherein a cross section of both the first wire and the second wire each correspond to a pentagonal shape, and wherein at least one adjacent side of the first wire is oblique to a closest side of the second wire.

6. The apparatus of claim 1, wherein parts of the upper portion and the lower portion of the shell are coplanar.

7. An apparatus, comprising:
    an inductor, including:
        a first wire;
        a second wire, parallel to the first wire;
        a non-conductive material covering the first wire and the second wire; and
        a shell, including an upper portion and a lower portion, surrounding a portion of the non-conductive material, wherein the shell includes at least one magnetized layer and at least one gap between the upper portion and the lower portion, and wherein a cross section of the upper portion of the shell includes a channel formed between the first wire and the second wire, and wherein an end of the upper portion of the shell extends past an end of the lower portion of the shell at an edge of the inductor where the at least one gap is formed.

8. The apparatus of claim 7, wherein a depth and a width of the channel are selected to impart a particular amount of inductance to the first wire and to the second wire.

9. The apparatus of claim 7, wherein parts of the upper portion and the lower portion of the shell are coplanar.

10. The apparatus of claim 7, wherein the upper portion of the shell includes a plurality of magnetized layers, wherein each layer is separated by a layer of non-conductive material, and wherein magnetic properties of each magnetized layer are different from one another.

11. The apparatus of claim 10, wherein a strength of a magnetic field of a first magnetized layer of the plurality of magnetized layers is greater than a strength of a magnetic field of a second magnetized layer of the plurality of magnetized layers that is closer to the first and second wires than the first magnetized layer.

12. The apparatus of claim 7, wherein a cross section of both the first wire and the second wire each correspond to a pentagonal shape, and wherein at least one adjacent side of the first wire is oblique to a closest side of the second wire.

13. The apparatus of claim 7, wherein a cross section of both the first wire and the second wire each corresponds to a hexagonal shape.

14. An apparatus, comprising:
a first inductor, including:
 a first wire;
 a second wire, parallel to the first wire;
 a first non-conductive material covering the first wire and the second wire; and
 a first upper shell surrounding a portion of the first non-conductive material, wherein the first upper shell includes at least one magnetized layer, and wherein the first upper shell includes a first portion and a second portion with a gap between the first portion and the second portion, the gap located between the first and second wires; and
a second inductor, including:
 a third wire;
 a fourth wire, parallel to the third wire;
 a second non-conductive material covering the third wire and the fourth wire; and
 a second upper shell surrounding a portion of the second non-conductive material, wherein the second upper shell includes at least one magnetized layer;
wherein the second inductor is inverted and attached on a bottom of the first inductor to form an inductive device, wherein the first wire and the third wire are parallel to each other.

15. The apparatus of claim 14, wherein the first wire is conductively coupled to the third wire and the second wire is conductively coupled to the fourth wire.

16. The apparatus of claim 15, wherein a cross section of the conductively coupled first wire and third wire corresponds to an octagonal shape.

17. The apparatus of claim 14, wherein a cross section of the first upper shell includes a channel formed between the first wire and the second wire.

18. The apparatus of claim 17, wherein a cross section of the second upper shell includes a channel formed between the third wire and the fourth wire.

19. The apparatus of claim 14, wherein the first upper shell and the second upper shell each include a plurality of magnetized layers, wherein each layer is separated by a layer of non-conductive material, and wherein magnetic properties of each magnetized layer are different from one another.

20. The apparatus of claim 14, further comprising a gap between the first upper shell and the second upper shell.

* * * * *